(12) United States Patent
Wang et al.

(10) Patent No.: US 8,631,382 B2
(45) Date of Patent: Jan. 14, 2014

(54) LVS IMPLEMENTATION FOR FINFET DESIGN

(75) Inventors: You-Jiun Wang, Hsin-Chu (TW); Kai-Ming Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/415,648

(22) Filed: Mar. 8, 2012

(65) Prior Publication Data

US 2013/0239077 A1    Sep. 12, 2013

(51) Int. Cl.
  *G06F 11/22* (2006.01)
  *G06F 17/50* (2006.01)

(52) U.S. Cl.
  USPC .............. 716/136; 716/55; 716/111; 716/122

(58) Field of Classification Search
  USPC ........................... 716/55, 106, 108, 111, 122
  See application file for complete search history.

(56) References Cited

U.S. PATENT DOCUMENTS

| | | | |
|---|---|---|---|
| 7,818,698 B2* | 10/2010 | Su et al. | 716/136 |
| 2005/0223347 A1* | 10/2005 | Okuaki | 716/5 |
| 2007/0226659 A1* | 9/2007 | Suaya et al. | 716/1 |
| 2008/0263492 A1* | 10/2008 | Chuang et al. | 716/10 |
| 2009/0007035 A1* | 1/2009 | Su et al. | 716/5 |
| 2009/0309162 A1* | 12/2009 | Baumgartner et al. | 257/368 |
| 2009/0326873 A1* | 12/2009 | Wang et al. | 703/1 |
| 2010/0183961 A1* | 7/2010 | Shieh et al. | 430/30 |
| 2010/0185994 A1* | 7/2010 | Pikus et al. | 716/5 |
| 2010/0248481 A1* | 9/2010 | Schultz | 438/694 |
| 2011/0023003 A1* | 1/2011 | Su et al. | 716/133 |
| 2012/0053923 A1* | 3/2012 | Li et al. | 703/14 |

OTHER PUBLICATIONS

Wu, W., et al., "Analysis of Geometry-Dependent Parasitics in Multifin Double-Gate FinFETs," IEEE Transactions on Electron Devices, vol. 54, No. 4, Apr. 2007, pp. 692-698.

* cited by examiner

*Primary Examiner* — Jack Chiang
*Assistant Examiner* — Brian Ngo
(74) *Attorney, Agent, or Firm* — Slater & Matsil, L.L.P.

(57) ABSTRACT

A method includes converting an active region in a layout of an integrated circuit into a fin-based structure that has a fin. The active region belongs to an integrated circuit device, and has a planar layout structure. The method further includes extracting a Resistance-Capacitance (RC) loading of the integrated circuit device using the parameters of the fin-based structure. The steps of converting and extracting are performed by a computer.

19 Claims, 8 Drawing Sheets

LVS IMPLEMENTATION FOR FINFET DESIGN

BACKGROUND

To continue Moore's law scaling in future Metal-Oxide-Semiconductor (MOS) technology, a new type of MOS devices, namely Fin Field-Effect Transistors (FinFETs), are become increasingly popular in the manufacturing of integrated circuits. Considering the area cost of integrated circuit design, the FinFETs have increase channel widths over planar transistors since the FinFETs use sidewall regions of fins as parts of the channel regions. The benefit is the saturation currents of the FinFETs accordingly become higher than that of traditional planar devices.

In a typical integrated circuit design process, a circuit schematic of the integrated circuit is generated first, for example, in a schematic editor. Pre-layout simulations are performed to ensure that the schematic of the integrated circuits may meet the design specification. Following the pre-layout simulations, the layout of the integrated circuit is generated, for example, using a layout editor. A design verification is then performed on the layout, wherein the design verification includes Design Rule Check (DRC), Layout Versus Schematic (LVS) verification, Layout Parameter Extraction (LPE), and parasitic Resistance-Capacitance (RC) Extraction (RCX).

After all physical verifications of the integrated circuit design are completed, designers will get layout netlists with parasitic RC network. A post-simulation verification is then performed to determine whether the simulation results meet design specification or not. If the design performance parameters obtained from the post-simulation verification meet the requirement of the design specification, the design can be signed off. Otherwise, the design process loops back to the schematic generation and editing steps, and the steps including the pre-layout simulation, the layout creation, the design verification, and the post-layout simulation are repeated to improve the design. The loop is repeated until eventually the circuit performance parameters meet the requirement of the design specification.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods for creating active regions (referred to as ODs hereinafter) for Fin Field-Effect Transistors (FinFETs) and other fin-based devices and extracting the respective Resistance-Capacitance (RC) loading are provided in accordance with various exemplary embodiments. Throughout the various views and illustrative embodiments, like reference numbers are used to designate like elements. Throughout the description, the term "fin" may refer to a semiconductor region that stands above the neighboring isolation regions in some exemplary embodiments.

Figure 1:
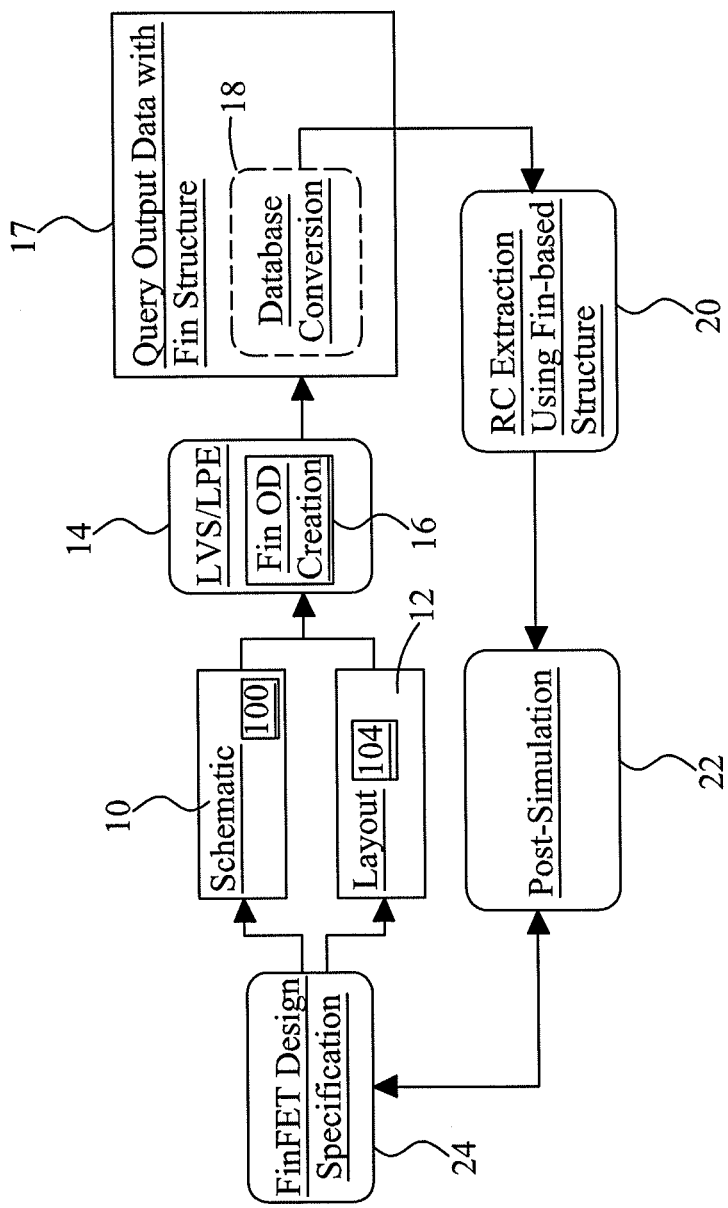
FIG. 1 illustrates a design flow chart of an integrated circuit design process in accordance with some exemplary embodiments.

FIG. 1 illustrates a design flow chart of an integrated circuit design process in accordance with exemplary embodiments. Each of the steps in FIG. 1 may be performed by a tool, which may include a computer and the corresponding program codes for performing the step. In alternative embodiments, a plurality of steps in FIG. 1 may be performed by a same computer. The steps shown in FIG. 1 may also be performed automatically by the computer(s).

Figure 2:
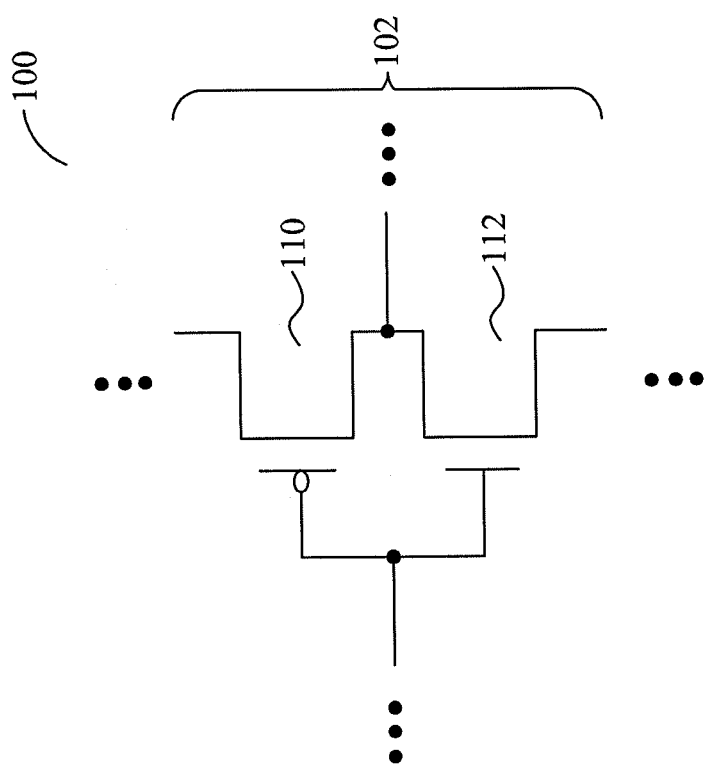
FIG. 2 illustrates an exemplary inverter in a schematic of a portion of an integrated circuit.

Referring to step 10, circuit schematic 100 of an integrated circuit that is being designed is generated. For example, FIG. 2 schematically illustrates schematic 100 of a portion of an exemplary integrated circuit, which is being designed in accordance with embodiments. The exemplary integrated circuit includes inverter 102, which is used as an example to explain the concept of the embodiments. It is realized that the actual designed circuit may include devices different from inverter 102. Inverter 102 includes PMOS transistor 110 and NMOS transistor 112, with the respective drain regions interconnected, and the gates interconnected.

Figure 3:
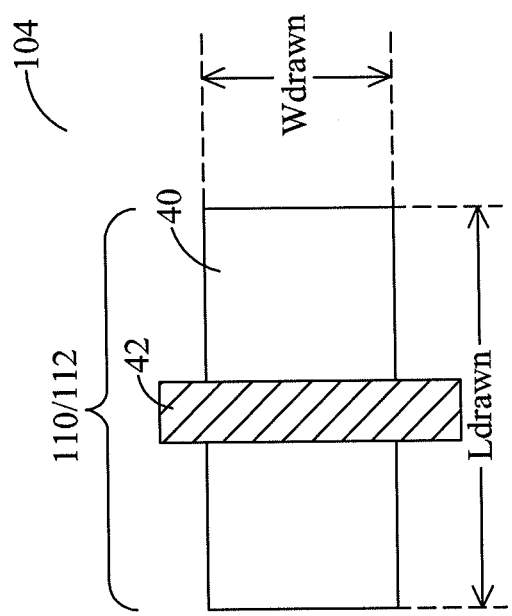
FIG. 3 illustrates an exemplary layout view of an exemplary planar MOS device.

Referring back to FIG. 1, in step 12, layout 104 of the integrated circuit that is to be designed is generated. In some embodiments, the layout generation may be schematic-driven, wherein the devices such as transistors, varactors, OD resistors, diodes, etc. are extracted from circuit schematic 100, and the layouts of the individual extracted devices may be generated. Schematic 100 and layout 104 may be embodied on a non-transitory storage media, such as a hard drive, a disc, or the like. The layouts of the individual extracted devices are placed to desirable locations of the layout, and may be connected to generate layout 104. In this step, the integrate circuit devices in schematic 100 and layout 104 are planar-structure devices, and the active regions (which are semiconductor regions when manufactured) are not fin-based yet. For example, FIG. 3 schematically illustrates a portion of layout 104 of the integrated circuit in accordance with exemplary embodiments. The illustrated portion of layout 104 includes the layout of transistor 110 (or 112). The layout of the transistor includes OD region 40, and gate electrode 42 crossing over OD region 40. The width of OD region 40 is referred to as layout-drawn width Wdrawn hereinafter, which is the dimension measured in the direction parallel to the lengthwise direction (the long side) of gate electrode 42. The layout, however, does not include the patterns of semiconductor fins. Accordingly, the layout in FIG. 3 is a planar layout, and the respective device 110/112 is a planar-structure device in a layout view.

Referring again to FIG. 1, step 14 includes the steps of Layout Versus Schematic (LVS) verification and Layout Parameter Extraction (LPE). In this step, schematic 100 of the integrate circuit is compared to layout 104 to ensure that layout 104 accurately implements schematic 100. During this step, a fin OD creation step (step 16) is performed. In order to perform the fin OD creation, the OD regions in layout 104 are extracted through the LPE. For example, OD region 40 in FIG. 3 is extracted, and the layout parameters such as layout-drawn width Wdrawn and layout-drawn length Ldrawn are obtained. The OD regions are then converted into fin-based structures in the fin OD creation step. An exemplary layout of the resulting fin-based structure that is created in the fin OD creation step is illustrated in FIG. 4.

Figure 4:
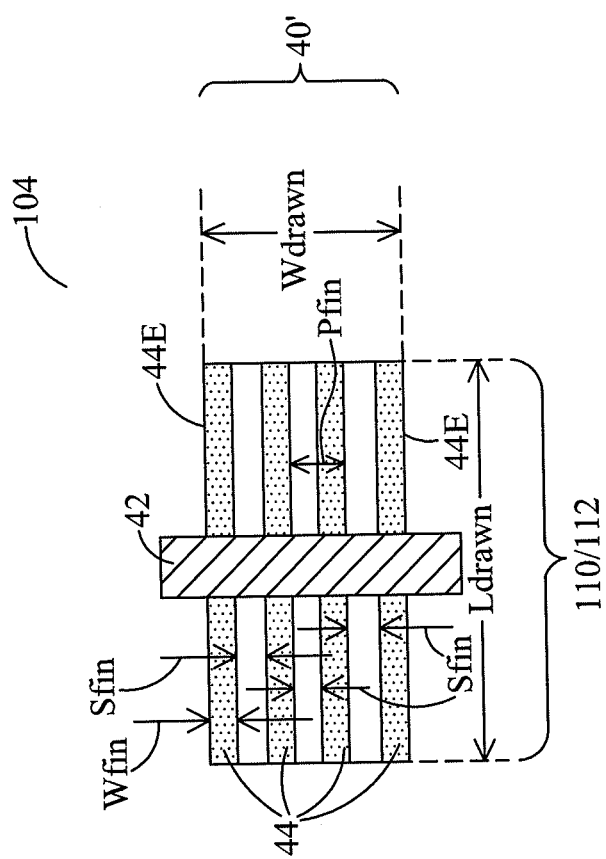
FIG. 4 illustrates a layout view of an exemplary fin-based MOS device.

In FIG. 4, region 40' has the same shape, same length Ldrawn, and same width Wdrawn as OD region 40 in FIG. 3. Two or more fins 44 are created and laid out in region 40'. In some embodiments, fins 44 have equal widths Wfin, although the widths of fins 44 may also be different in various technology processes. Fins 44 are spaced apart from each other by spacings Sfin. In some embodiments, spacings Sfin are equal to each other, although they may also be different from each other. Width Wfin and spacing Sfin may be pre-specified, and may be related to the technology that is to be used to manufacture the integrated circuit on a semiconductor wafer. To allocate a maximum number of fins 44, two fins 44 may be placed with their outer edges 44E aligned to the boundaries of region 40'. Accordingly, the layout-drawn width Wdrawn may be expressed as:

$$Wdrawn=Wfin*Nfin+Sfin*(Nfin-1) \qquad [Eq. 1]$$

wherein Nfin is the maximum number of fins that can be created within region 40', and Nfin is the total count of fins 44 in region 40'.

It is observed that fins 44 have pitch Pfin equal to (Wfin+Sfin). Accordingly, Equation 1 may be rewritten as:

$$Nfin=(Wdrawn+Sfin)/Pfin \qquad [Eq. 2]$$

Using Equation 2, the maximum number (total count) of fins 44 that can be allocated in region 40' may be calculated. It is observed that if the calculated maximum number of fins Nfin is not an integer, the remainder will be discarded, and the count of the created fins will be equal to the integer part of the calculated Nfin.

With Nfin being calculated, referring back to step 16 in FIG. 1, fins 44 are created in region 40' (FIG. 4) to form the layout of the respective integrated circuit device such as transistor 110/112. Fins 44 are allocated in the direction perpendicular to the lengthwise direction of gate electrode 42. The FinFET OD creation step is performed on each of the OD relative devices that are desired to be converted to fin-based devices. In some embodiments, the newly created layouts (which include the fin-based structures) of the integrated circuit devices may replace the planar devices in layout 104 (FIG. 1) to create an integrated updated layout for the integrated circuit. The updated layout may be saved into a database and saved on a non-transitory storage media. The updated layout may be used for the manufacturing of the integrated circuit on wafers.

Figure 8:
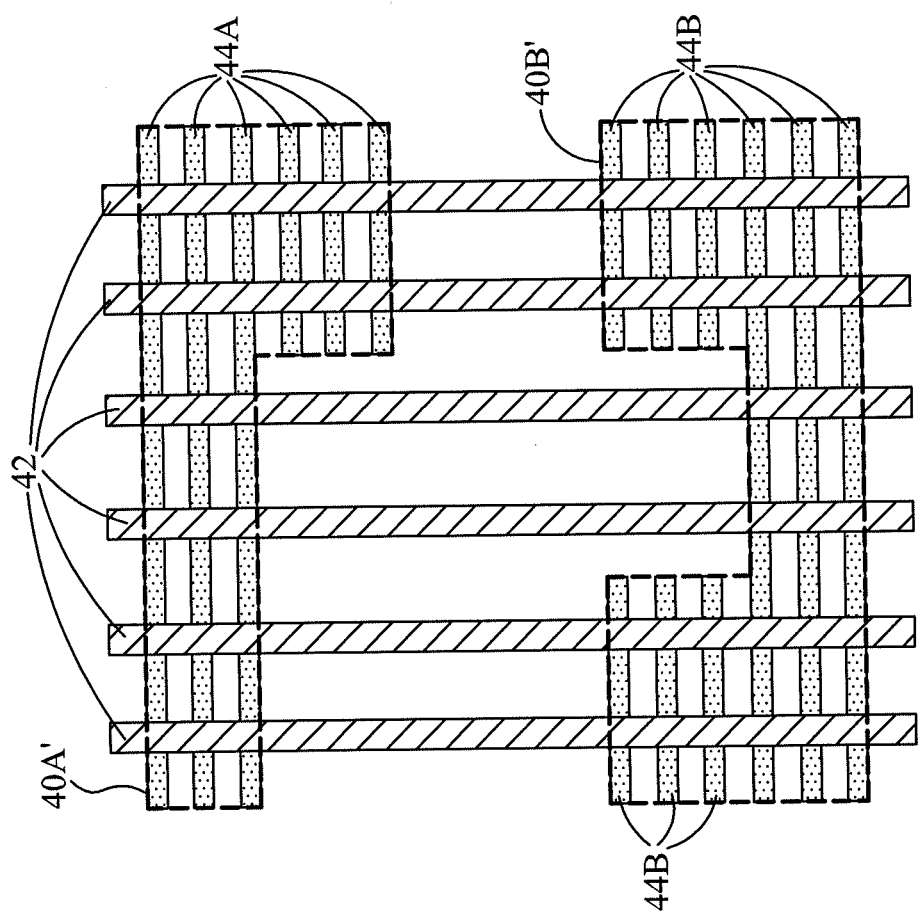
FIG. 8 illustrates an inverter example with fin-based structures converted from active regions that have non-rectangular shapes.

It is appreciated that although in FIGS. 3 and 4, a rectangular OD region is used as an exemplary embodiment. The OD region that may be converted to fins may have any other shape, including, and not limited to, L shapes, U-shapes, and the like. For example, FIG. 8 illustrates L-shaped region 40A', in which a plurality of fins 44A is formed, and is converted from the L-shaped planar active region of the respective planar devices. FIG. 8 also illustrates U-shaped region 40B', in which a plurality of fins 44B is formed, and is converted from the U-shaped planar active region of the respective planar devices.

Next, referring again to FIG. 1, in step 17, the data of the integrated circuit devices having the fin-based structures (for example, refer to FIG. 4), which include, but not limited to, FinFETs, fin-based diodes, fin-based varactors, fin-based resistors, and the like, are queried (block 17) from the database used by step 14, and are provided to a tool (step 20). When the integrated circuit devices include a FinFET, for example, the queried data includes fin numbers (such as Nfin in Equation 2), fin shapes (such as the shapes of the illustrated fins 44 in FIG. 4 and fins 44A and 44B in FIG. 8), fin connections, and the like. The tool (also symbolized by block 20) extracts the Resistance-Capacitance (RC) loading of integrated circuit devices. If the database used by the tool (referred to as a first tool hereinafter) for performing step 14 has a different format than the format used by the tool (referred to as a second tool hereinafter) for performing step 20, a database conversion is performed (step 18). Accordingly, integrated circuit devices having the fin-based structures, which are in the same format understood by the first tool, is converted to have a format that can be used by the second tool. If the tools for performing steps 14 and 20 have the same format, the database conversion step 18 may be omitted.

In step 20, the RC loading of the fin-based structures are extracted, which RC loading include the parasitic resistances and parasitic capacitances of the fin-based structures. Simulation results have indicated that when the RC extraction step 20 is performed on actual fin-based structures rather than using planar-layout structures (such as what is shown in FIG. 3), the accuracy of the extracted RC loading may be improved by about 1.5 times to two times. The results may be saved into a file, and used in the post-simulation, as shown as step 22.

Referring again to FIG. 1, post-simulation 22 is performed to generate a full-fledged evaluation result of the layout that includes the 3D based structures. Since the RC loading of the fin-based structures accurately represents the fin-based structures that are to be manufactured on wafers, the post-simulation results obtained from post-simulation 22 are more accurate. After post simulation 22 is performed, the circuit performance parameters of the entire integrated circuit are generated, and are compared to the requirements of the FinFET design specification 24. FinFET design specification 24 is the specification that is based on the FinFETs manufacturing processes. The design process may loop back to steps 10 and 12 to modify the design in the case the circuit performance parameters do not meet the requirements of the design specification, and steps 14, 16, 17, 18, 20, and 22 may be repeated. Otherwise, if the circuit performance parameters obtained from post-simulation 22 meet the requirements of the design specification, the circuit and the layout may be signed off, and the design is finished.

Figure 5:
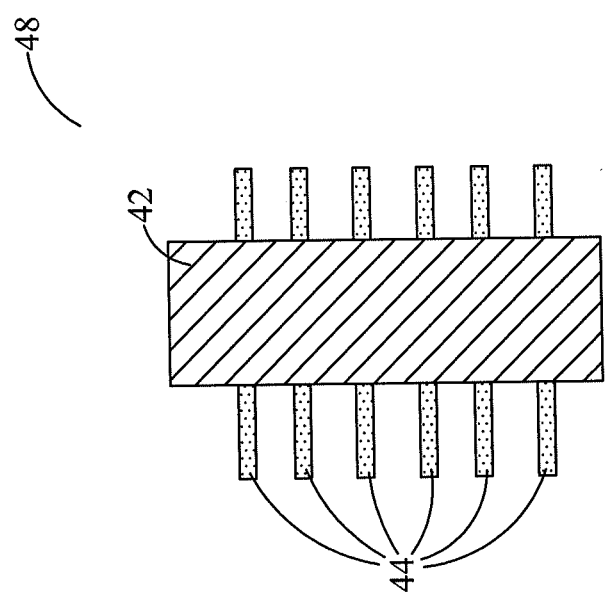
FIGS. 5 through 7 illustrate layout views of exemplary FinFET devices, each having a plurality of fingers of fin-based structures.
Figure 6:
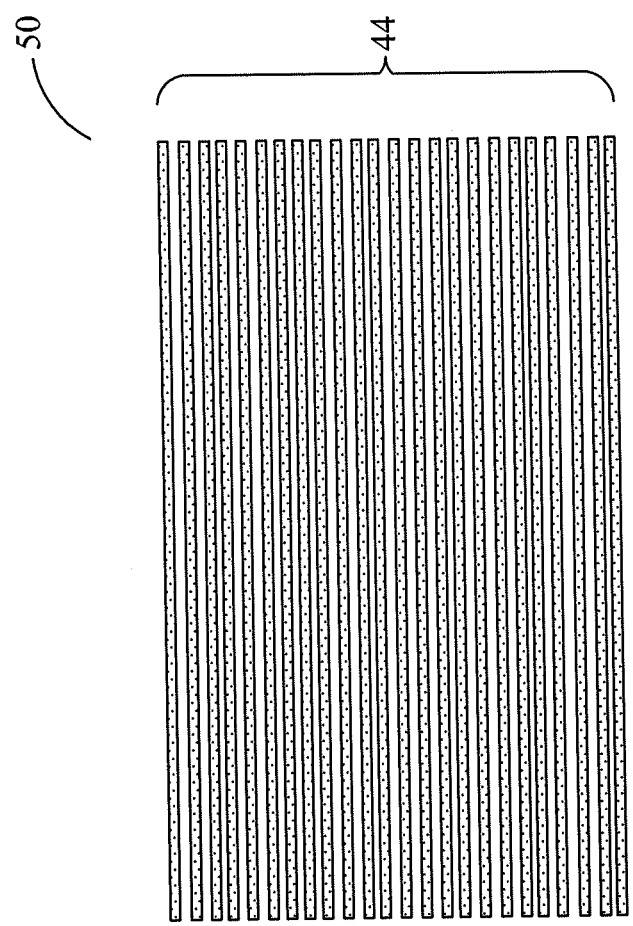
Figure 7:
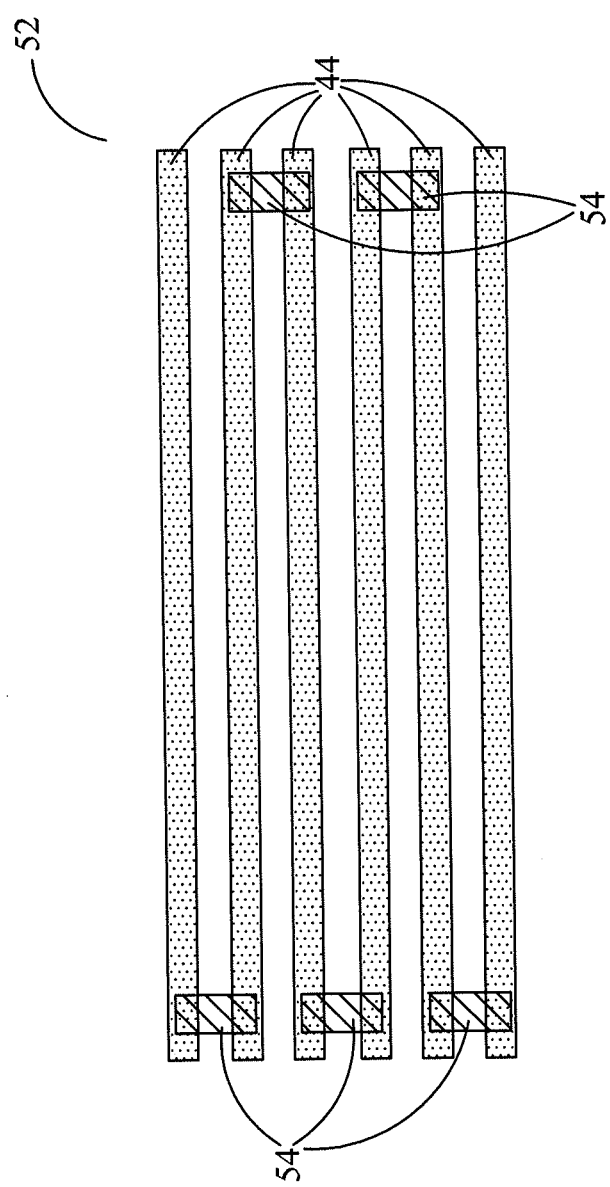

Some exemplary fin-based structures, which may be created in step 16 (FIG. 1) and whose RC loading is extracted in step 20, are illustrated in FIGS. 5 through 7. FIG. 5 illustrates MOS varactor 48, which includes wide gate electrode 42 formed on a plurality of fins 44. Gate electrode 42 forms a capacitor with fins 44. FIG. 6 illustrates a plurality of fins 44 that occupies a large chip area, wherein the plurality of fins 44 and the epitaxy regions formed thereon (not shown) may form the anode or the cathode of diode 50. FIG. 7 illustrates a plurality of fins 44, which may be connected in series, for example, by metal lines 54 to form OD resistor 52.

In accordance with embodiments, a method includes converting an active region in a layout of an integrated circuit into a fin-based structure that has a fin. The active region belongs to an integrated circuit device, and has a planar-layout structure. The method further includes extracting The RC loading of the integrated circuit device using the parameters of the fin-based structure. The steps of converting and extracting are performed by a computer.

In accordance with other embodiments, a method includes performing an LVS verification to verify a layout of an integrated circuit against a schematic of the integrate circuit. A width of an active region of an integrated circuit device is extracted from the layout, wherein the active region is a planar active region. A plurality of fins is created in the active region to form a fin-based structure for the integrated circuit device. The RC loading of the integrated circuit device is extracted using the fin-based structure. One of the steps of the LVS verification, extracting the width, creating the plurality of fins, and extracting the RC loading is performed by a computer.

In accordance with yet other embodiments, an apparatus includes a first tool and a second tool. The first tool is configured to perform an LVS verification to verify a layout of an integrated circuit against a schematic of the integrated circuit, and extract a width of an active region of an integrated circuit device from the layout, wherein the active region is a planar active region. The first tool is further configured to create a plurality of fins in the active region to form a fin-based structure for the integrated circuit device. The second tool is configured to extract the RC loading of the integrated circuit device that has the fin-based structure.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   converting an active region in a layout of an integrated circuit into a fin-based structure comprising a fin, wherein the active region belongs to an integrated circuit device, and wherein the active region has a planar layout structure;
   extracting a Resistance-Capacitance (RC) loading of the integrated circuit device using parameters of the fin-based structure, wherein the steps of converting and extracting are performed by a computer;
   performing a post-simulation using the RC loading of the integrated circuit device; and
   comparing results obtained from the post-simulation with a design specification.

2. The method of claim 1 further comprising:
   performing a Layout Versus Schematic (LVS) verification to verify the layout against a schematic of the integrate circuit; and
   performing a Layout Parameter Extraction (LPE) to extract parameters of the layout, wherein the parameters of the layout comprise a width of the active region.

3. The method of claim 1 further comprising:
   calculating a number of fins that can be placed in the active region; and
   creating a plurality of fins in the active region of the layout, wherein a count of the plurality of fins is equal to the number.

4. The method of claim 3, wherein the step of calculating the number is performed using equation:

$$Nfin=(Wdrawn+Sfin)/Pfin$$

wherein Nfin is the number, Wdrawn is a width of the active region, Sfin is a spacing between neighboring ones of the plurality of fins, and Pfin is a pitch of the plurality of fins.

5. The method of claim 1, wherein the integrated circuit device is selected from the group consisting essentially of a transistor, a varactor, a diode, and a resistor.

6. The method of claim 1, wherein the active region has a rectangular shape.

7. The method of claim 1, wherein the active region has a shape selected from the group consisting essentially of an L-shape and a U-shape.

8. The method of claim 1 further comprising:
   when the results do not meet the design specification, modifying the layout of the integrated circuit; and
   repeating the converting the active region step, the extracting the RC loading step, the performing the performing the post-simulation step, and the comparing results step on the modified layout of the integrated circuit.

9. A method comprising:
   performing a Layout Versus Schematic (LVS) verification to verify a layout of an integrated circuit against a schematic of the integrate circuit;
   extracting a width of an active region of an integrated circuit device from the layout, wherein the active region is a planar active region;
   creating a plurality of fins in the active region to form a fin-based structure for the integrated circuit device;
   extracting a Resistance-Capacitance (RC) loading of the integrated circuit device using the fin-based structure, wherein one of the steps of the LVS verification, extracting the width, creating the plurality of fins, and extracting the RC loading is performed by a computer;
   performing a post-simulation using the RC loading of the integrated circuit device; and
   comparing results obtained from the post-simulation with a design specification.

10. The method of claim 9 further comprising, before the step of creating the plurality of fins, calculating a total count of the plurality of fins.

11. The method of claim 10, wherein the step of calculating the total count is performed using equation:

$$Nfin=(Wdrawn+Sfin)/Pfin$$

wherein Nfin is the total count, Wdrawn is a width of the planar active region, Sfin is a spacing between neighboring ones of the plurality of fins, and Pfin is a pitch of the plurality of fins.

12. The method of claim 9, wherein the integrated circuit device is selected from the group consisting essentially of a transistor, a varactor, a diode, and an active-region based resistor.

13. The method of claim 9, wherein the active region has a rectangular shape.

14. The method of claim 9, wherein a shape of the active region is selected from the group consisting essentially of an L-shape and a U-shape.

15. An apparatus comprising:
   a first tool configured to:

perform a Layout Versus Schematic (LVS) verification to verify a layout of an integrated circuit against a schematic of the integrated circuit;
extract a width of an active region of an integrated circuit device from the layout, wherein the active region is a planar active region; and
create a plurality of fins in the active region to form a fin-based structure for the integrated circuit device;
a second tool configured to extract a Resistance-Capacitance (RC) loading of the integrated circuit device that comprises the fin-based structure; and
a fourth tool configured to:
perform a post-simulation using the RC loading of the integrated circuit device; and
compare the results of the post-simulation with a design specification.

16. The apparatus of claim 15 further comprising a third tool for converting a format used by the first tool to a format used by the second tool.

17. The apparatus of claim 15, wherein the first tool is further configured to, before creating the plurality of fins, calculate a total count of the plurality of fins that fits into the active region.

18. The apparatus of claim 17, wherein the first tool is further configured to calculate a total count of the plurality of fins using equation:

$$Nfin = (Wdrawn + Sfin)/Pfin$$

wherein Nfin is the total count, Wdrawn is a width of the active region, Sfin is a spacing between neighboring ones of the plurality of fins, and Pfin is a pitch of the plurality of fins.

19. The apparatus of claim 15, wherein the first tool is configured to convert active regions of planar devices to fin-based structures, and wherein the planar devices are selected from the group consisting essentially of a transistor, a varactor, a diode, an active-region based resistor, and combinations thereof.

* * * * *

UNITED STATES PATENT AND TRADEMARK OFFICE
CERTIFICATE OF CORRECTION

PATENT NO. : 8,631,382 B2
APPLICATION NO. : 13/415648
DATED : January 14, 2014
INVENTOR(S) : You-Jiun Wang It is certified that error appears in the above-identified patent and that said Letters Patent is hereby corrected as shown below:

In the Claims

In Col. 6, line 24, claim 8, delete "the performing the performing" and insert --the performing--.

Signed and Sealed this
Eleventh Day of March, 2014

Michelle K. Lee
*Deputy Director of the United States Patent and Trademark Office*